United States Patent [19]

Matsui

[11] Patent Number: 4,495,548
[45] Date of Patent: Jan. 22, 1985

[54] SPACER FOR WIRING BOARDS AND ASSEMBLED STRUCTURE THEREOF

[75] Inventor: Kazuhiro Matsui, Toyoake, Japan

[73] Assignee: Kitagawa Industries Co., Ltd., Nagoya, Japan

[21] Appl. No.: 441,000

[22] Filed: Nov. 12, 1982

[51] Int. Cl.³ .............................................. H05K 7/12
[52] U.S. Cl. ............................ 361/413; 174/138 D; 361/412; 361/420
[58] Field of Search ................. 174/138 D; 361/412, 361/413, 420

[56] References Cited

U.S. PATENT DOCUMENTS

| | | | |
|---|---|---|---|
| 2,936,015 | 5/1960 | Rapata | 174/138 D |
| 3,568,001 | 3/1971 | Straus | 361/413 |
| 3,836,703 | 9/1974 | Coules | 174/138 D |
| 4,143,577 | 3/1979 | Eberhardt | 174/138 D X |
| 4,297,769 | 11/1981 | Coules | 174/138 D |

Primary Examiner—R. R. Kucia
Attorney, Agent, or Firm—Oblon, Fisher, Spivak, McClelland & Maier

[57] ABSTRACT

A spacer having an upper substrate at the center of which a coupling hole is formed, a lower substrate which is provided opposite to the upper substrate, and a plurality of support members bridging between the upper and the lower substrates so as to retain a space therebetween in which the mechanical strength against the loads applied in the horizontal direction as well as in the direction of twisting is extremely large, thus enabling the spacer according to the present invention to resist failure even if these large loads are applied thereto unlike the prior art spacers and thus obtaining a secured snap-fitting as well as thus making possibility of the spacer coming off from the wiring board difficult.

11 Claims, 6 Drawing Figures

SPACER FOR WIRING BOARDS AND ASSEMBLED STRUCTURE THEREOF

BACKGROUND OF THE INVENTION

1. Field of the Invention

The present invention relates to an improvement in a spacer for wiring boards such as print circuit boards for securing a suitable space between a plurality of wiring boards and for fixing the wiring boards when using a plurality of wiring boards or print circuit boards in a stacked condition, and also relates to an assembled structure thereof.

2. Description of the Prior Art

Heretofore, in electronic apparatuses, when mounting a wiring board or boards on a chassis or when mounting another wiring board or boards on one wiring board, support members are used which are secured between the wiring boards and a chassis or between the wiring boards by screws so that a number of steps are required for the operations of mounting the wiring boards, and also there is a disadvantage of high costs for mounting parts as a lot of parts are used.

As an improvement for overcoming these disadvantages, a spacer such as disclosed in the U.S. Pat. No. 3,836,703 has been proposed, which is integrally formed by using synthetic resin and which can be secured on a chassis or a wiring board in one step by using the resiliency of the synthetic resin and by snap-fitting the same.

Although there were, to be sure, some improvements in the reduction of the number of mounting steps and the cost thereof in the spacer disclosed in this patent compared with the one in which screws and support members are used, it had also a drawback that it had low mechanical strength against a load applied to the board in the horizontal direction or a load applied in the direction of twisting because of its rectangular form with substrates placed opposite to each other, with two side plates tying or bridging the substrates in order to retain the space between the wiring boards, thus resulting in a tendency for the support members to fail when only a small load is applied thereto.

SUMMARY OF THE INVENTION

It is therefore an object of the present invention to provide a spacer for wiring boards in which the drawbacks of these kinds of spacers according to the prior art described above can be overcome.

It is a another object of the present invention to provide a spacer made of synthetic resin and for wiring boards in which a plurality of support members are radially arranged from the center with substrates placed opposite each other being bridged by the support members so as to secure the space therebetween.

It is another object of the present invention to provide a spacer in which the mechanical strength against a load applied to the wiring boards or print circuit boards in the horizontal direction and a load applied in the direction of twisting are extremely large.

It is still another object of the present invention to provide a spacer having an arc like resilient plate push piece and a resilient coupling member to which it can securely, so that one can fix the boards by utilizing resilient forces applied in the upper and lower directions of the arc like resilient plate push piece as well as another resilient force applied in the right and left direction of the resilient coupling member.

It is yet still another object of the present invention to provide an assembled structure of the spacers and wiring boards or print circuit boards in which a plurality of wiring boards or print circuit boards can be successively stacked by mounting a plurality of the spacers according to the present invention.

According to the present invention, the spacer for securing the wiring board includes an upper substrate on the center of which a coupling hole is formed, a lower or bottom substrate which is provided opposite to the upper substrate, and a plurality of support members tying or bridging the upper and the lower substrates so as to retain a space therebetween, with the result that the mechanical strength against loads applied thereto has been strengthened, thus enabling the spacer not to fail even if these large loads are applied thereto, unlike the conventional spacers.

These and other objects, advantages and features of the present invention will become apparent from the following detailed description particularly when taken in conjunction with the accompanying drawings.

DESCRIPTION OF THE PREFERRED EMBODIMENT

Figure 1:
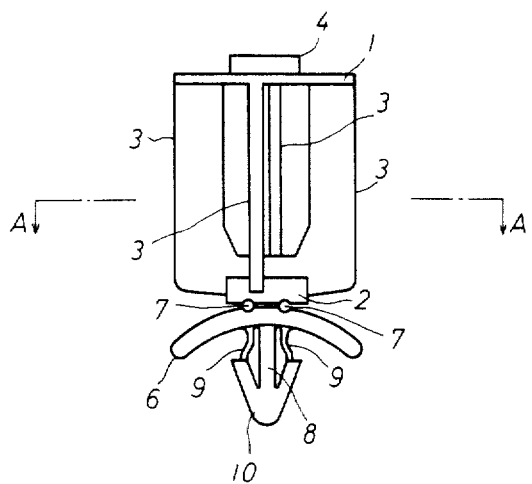
FIG. 1 is an elevational view of the spacer of one embodiment according to the present invention.

Referring to FIGS. 1, 2, 3 and 4, an embodiment of a spacer according to the present invention includes an upper substrate 1 and a lower substrate 2 which are placed one another in the upper and lower positions with a desirable predetermined distance therebetween, a plurality of support members 3 in the shape of plate respectively (in this embodiment, four support members) which tie or bridge the upper substrate 1 and the lower substrate 2, a flange portion 4, a resilient plate push piece 6 in the form of arc or bow shape in cross-section, and a resilient coupling member 10 with thin linkage members 9 which are also in the form of a small arc, respectively.

Figure 2:
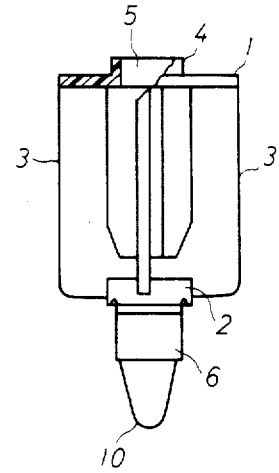
FIG. 2 is a side view of the spacer according to the present invention in partial cross-section.
Figure 3:
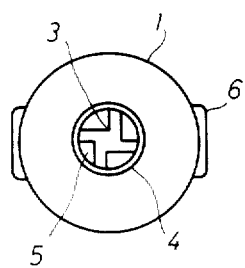
FIG. 3 is a plane view of the spacer according to the present invention.

The flange portion 4 formed on the upper surface of the upper substrate 1 is to be inserted into a mounting hole formed on a wiring board or print circuit board to be mounted thereto. A coupling hole 5 is formed in the center of the flange portion 4, the detail of which is shown in FIG. 2. The inner space surrounded by the support members is substantially larger than the diameter of the coupling hole 5 and it has a suitable space larger than that of the resilient coupling member 10 so as not to restrain the expansion of the resilient coupling member 10.

The resilient plate push piece 6 in the form of an arc is provided generally at the center portion of the bottom of the lower substrate 2. Also, a plurality of circular notches 7 are formed on the right and left of the link portions of the resilient plate push piece 6 and the lower substrate 2. The root portion of the push piece 6 is formed thin so as to be easily flexible.

The outer shape of the resilient coupling member 10 has generally a conical shape or an arrowhead like shape made of synthetic resin with a good resiliency so as to easily enable the head to be inserted into the mounting hole of the wiring board or print circuit board. A link plate 8 is formed in the center of the resilient coupling member 10, which is rather thick and is integrally formed with the resilient coupling member 10 made of the synthetic resin. The right and left end portions of the resilient coupling member 10 are provided with thin link members 9 having a curved arc shape, respectively. All the elements described above are integrally formed in one piece made of the synthetic resin.

Figure 4:
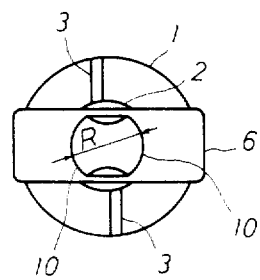
FIG. 4 is a bottom view of the spacer according to the present invention.
Figure 5:
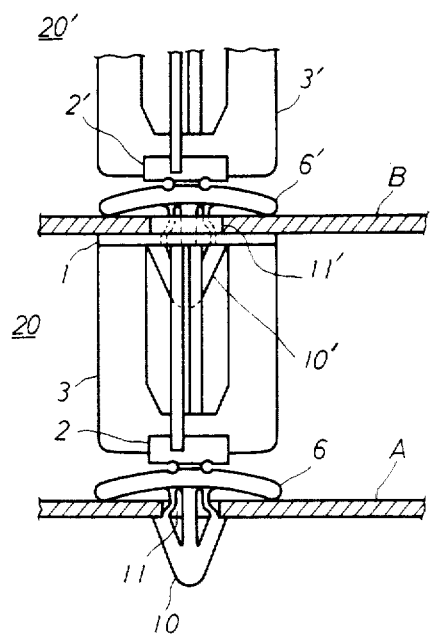
FIG. 5 is an elevational view of the spacer according to the present invention and the wiring boards or print circuit boards in a mounted condition.
Figure 6:
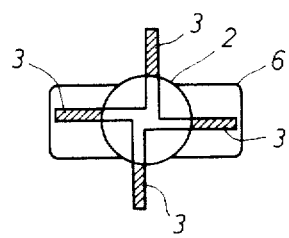
FIG. 6 is a cross sectional view of the spacer shown in FIG. 1 cut along the line A—A.

FIG. 5 shows the spacer according to the present invention mounted on between the two wiring boards or print circuit boards A and B. The mounting of the spacer on the print circuit boards can be performed as follows; First of all, the resilient coupling member 10 of the spacer in accordance with the present invention is inserted by applying pressure into the mounting hole 11 on the circuit board A. However, in this case as the diameter of the mounting hole 11 is slightly smaller than the maximum diameter R of the resilient coupling member 10 as shown in FIG. 4, the right and left end portions of the resilient coupling member 10 in the position indicated in FIG. 5 are flexed inwardly, due to the insertion by pressure while the edge portions of the resilient plate 6 are flexed toward the upper side thereof, respectively. As a result, the print circuit board A is resiliently fixed between the right and left upper end portions or edges of the resilient plate push piece 6. In this case, since the right and left end portions of the resilient coupling member return to the external side thereof by the resilient force of the thin link piece 9 shown in FIG. 1, the resilient fixation of the print circuit board A can be carried out extremely securely.

Next, after inserting or fitting the flange portion 4 (see FIGS. 1 and 2) of the spacer into a mounting hole 11 of another print circuit board B, a second spacer having the portions 2', 3', 6' etc. may be inserted by pressure into the mounting hole 11 of the second print circuit board B in a similar manner. At this time, the resilient coupling member 10' of the second spacer can be resiliently fixed with the coupling hole 5 of the first stage spacer while the resilient plate push piece 6' pushes the upper surface of the print circuit board B, thus fixing or securing the print circuit board B. In this manner, a plurality of the wiring boards or print circuit boards can be successively stacked by mounting a plurality of spacers according to the present invention at a suitable space which is determined by the actual length of the spacer used.

Finally, when securing the last print circuit board, a cap member for the spacer and having only the resilient plate push plate 6 and the resilient coupling member 10 is used for fixing or securing the final stage print circuit board.

As described in the foregoing, the spacer for securing the wiring boards or the print circuit boards is constructed in such a manner that the spacer mainly comprises an upper substrate at the center of which a coupling hole is formed, an lower substrate which is provided opposite to the upper substrate, a plurality of support members bridging the upper and the lower substrates so as to retain a space therebetween, with the result that the mechanical strength against a load applied to the wiring boards or print circuit boards thus mounted in the horizontal direction and/or the load applied in the direction of twisting is extremely large, thus enabling the spacer according to the present invention to resist failure even if these large loads are applied thereto, unlike the conventional these kinds of spacers.

Moreover, when the right and left edge portions of the resilient coupling member as shown in the embodiment according to the present invention are coupled or engaged with the mounting hole of one print circuit board through the thin coupling pieces in the form of arc, a secured snap-fitting is obtained so that the spacer according to the present invention is resistant to vibrations applied to the boards as well as to repeated loads, thus making possibility of the coupling member coming off of the spacer or spacers difficult.

In the foregoing embodiment according to the present invention, although the resilient coupling member is shown in the form of a conical head, it may be any other similar shape or it may do without the link piece 9.

Furthermore, in the spacer according to the present invention, even if the thickness of the wiring boards or print circuit boards may be changed in some degree, one can securely fix the boards by utilizing the resilient force applied in the upper and lower directions of the arc like resilient plate push piece as well as another resilient force applied in the right and left direction of the resilient coupling member.

Although the invention has been described in its preferred embodiments, it is to be understood that the words which have been used are words of description rather than limitation and that various changes may be made within the purview of the appended claims without departing from the true scope and spirit of the invention in its broader aspects.

What is claimed is:

1. A spacer for wiring board which comprises construction elements as follows:
   an upper substrate having a flange portion at the center of which a coupling hole is formed which penetrates through said upper substrate;
   a lower substrate opposite to said upper substrate;
   a plurality of support members bridging said upper and lower substrates so as to maintain a space therebetween;
   a resilient coupling member having a plurality of link pieces and a link plate; and
   a resilient plate push piece formed between one side of said lower substrate and end portions of said link pieces and said link plate,
   all of said construction elements, including said upper substrate, said lower substrate, the plurality of said support members, and said resilient plate push piece being integrally formed in one piece.

2. A spacer for wiring boards as set forth in clam 1 wherein said upper substrate and said lower substrate each have a circular shape respectively, the diameter of said upper substrate being larger than that of said lower substrate.

3. A spacer for wiring boards as set forth in claim 1 wherein all of said construction elements are made of synthetic resin.

4. A spacer for wiring boards as set forth in claim 1 wherein said resilient coupling member has one of an arrowhead shaped and a conical head.

5. A spacer for wiring boards as set forth in claim 1 wherein an inner space surrounded by said support members is substantially larger than the diameter of the coupling hole.

6. A spacer for wiring boards as set forth in claim 1 wherein said resilient plate push piece has a bow-shaped cross-section, whereby the resiliency of said push piece gives a firm securing force to a wiring board to be mounted.

7. A spacer for wiring boards as set forth in claim 1 wherein circular notches are formed on opposite sides of a linking portion between the resilient plate push piece and one side of the lower substrate, and a root portion of the resilient plate push piece is comparatively formed thin as compared to a remainder of said push piece so as to allow the portions to be flexible.

8. A spacer for wiring boards as set forth in claim 1 wherein the number of the support members is four.

9. A spacer for wiring boards as set forth in claim 1 wherein the diameter of said coupling hole formed on the flange portion is slightly smaller than the maximum diameter of said resilient coupling member so as to enable a coupling member of a second spacer to be inserted into the coupling hole of a first spacer through a mounting hole of the wiring boards to be mounted when a plurality of wiring boards are stacked.

10. An assembled structure having a plurality of the spacers as set forth in claim 1 and a plurality of wiring boards or print circuit boards, comprising:
- a first wiring board having a mounting hole, the diameter of which is slightly larger than that of the flange portion thereof;
- a second wiring board identical to the first wiring board;
- a first spacer coupled between said first and second wiring boards with the coupling member thereof inserted into the mounting hole of the first wiring board, the flange portion of the first spacer being inserted into the mounting hole of the second wiring board; and
- a second spacer being inserted into the coupling hole of the first spacer and through the mounting hole of the second wiring board.

11. An assembled structure as set forth in claim 10 wherein a plurality N of wiring boards or printing circuit boards (where $N=2, 3, 4 \ldots k$) are stacked by a plurality of $N-1$ spacers.

* * * * *